(12) United States Patent
Kuroki et al.

(10) Patent No.: US 7,983,096 B2
(45) Date of Patent: Jul. 19, 2011

(54) SEMICONDUCTOR DEVICE INCLUDING NONVOLATILE MEMORY

(75) Inventors: Kenichiro Kuroki, Kawasaki (JP); Andreas Bandt, Langen (DE)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/031,170

(22) Filed: Feb. 18, 2011

(65) Prior Publication Data

US 2011/0134709 A1    Jun. 9, 2011

Related U.S. Application Data

(62) Division of application No. 12/424,814, filed on Apr. 16, 2009.

(30) Foreign Application Priority Data

Jun. 19, 2008    (JP) .................................. 2008-161032

(51) Int. Cl.
G11C 7/06    (2006.01)
G11C 7/00    (2006.01)
G11C 16/04    (2006.01)
G11C 29/00    (2006.01)

(52) U.S. Cl. ............. 365/189.07; 365/185.04; 365/195; 365/196; 365/201

(58) Field of Classification Search .............. 365/189.07
See application file for complete search history.

(56) References Cited

U.S. PATENT DOCUMENTS

| | | | |
|---|---|---|---|
| 7,441,164 B2 * | 10/2008 | Guettaf | 714/718 |
| 7,463,519 B1 | 12/2008 | Kikuchi | |
| 2001/0052070 A1 | 12/2001 | Oishi et al. | |
| 2004/0184339 A1 * | 9/2004 | Ozawa | 365/230.03 |
| 2006/0095975 A1 * | 5/2006 | Yamada et al. | 726/27 |
| 2009/0174425 A1 * | 7/2009 | Kang | 324/763 |
| 2010/0061131 A1 | 3/2010 | Bosmuller et al. | |

FOREIGN PATENT DOCUMENTS

| | | |
|---|---|---|
| JP | 01-118933 | 5/1989 |
| JP | 01-279344 | 11/1989 |
| JP | 04-168700 | 6/1992 |
| JP | 10-314451 | 2/1998 |
| JP | 2001-209580 | 8/2001 |
| JP | 2001-339383 | 12/2001 |

OTHER PUBLICATIONS

USPTO, (MAI) Non-Final Rejection, Oct. 19, 2010, in parent U.S. Appl. No. 12/424,814 [pending].
USPTO, [MAI] "U.S. Appl. No. 12/424,814 (parent)," Notice of Allowance and Fee(s) Due, issued on Mar. 9, 2011.

* cited by examiner

*Primary Examiner* — Son Mai
(74) *Attorney, Agent, or Firm* — Fujitsu Patent Center (57)    ABSTRACT

A semiconductor device includes a nonvolatile memory configured to store write data in a write-enabled state, a check circuit configured to enable the write data as data for comparison in response to an enabled-status indicating signal indicative of the write-enabled state and to output a result of comparison obtained by comparing data read from the nonvolatile memory with the enabled data for comparison, and a path configured to output the result of comparison output from the check circuit to outside the semiconductor device, wherein no path to output the data read from the nonvolatile memory to outside the semiconductor device is in existence.

6 Claims, 11 Drawing Sheets

SEMICONDUCTOR DEVICE INCLUDING NONVOLATILE MEMORY

CROSS-REFERENCE TO RELATED APPLICATIONS

The present application is a divisional of application Ser. No. 12/424,814, filed Apr. 16, 2009, which claims the benefit of priority from the prior Japanese Patent Application No. 2008-161032 filed on Jun. 19, 2008, with the Japanese Patent Office, the entire contents of which are incorporated herein by reference.

FIELD

The disclosures herein generally relate to semiconductor devices.

BACKGROUND

An apparatus such as a television set and a set-top box for processing high-quality video data and audio data generally encrypts its data for transmission in order to prevent illegal copying and data tampering. For such encryption and decryption purposes, a nonvolatile memory device may be embedded that stores a device unique ID and/or a communication key in a rewritable manner.

In order to prevent encryption from being decoded through illegal means, provision is made such that data stored in a nonvolatile memory may not be easily read for purposes other than the intended purpose. A memory that has a mechanism for protecting the security of data contents is referred to as a secure memory.

In a configuration in which a secure memory is mounted in an SoC (System on Chip), there are conflicting requirements, i.e., a requirement to prohibit the stored data from being read for the purpose of protecting its security and a requirement to read the stored data for the purpose of checking the correctness of written data. A means to check the correctness of stored data while maintaining a high security level includes a check mechanism that utilizes a CRC (Cyclic Redundancy Check) method, a parity method, a check-sum method, or the like to indirectly check data correctness without actually retrieving the data to be checked. Such a check mechanism, however, may not be able to detect error for some types of data failures. Further, a need to correct an error in addition to detecting an error, if such a need exists, may result in an increase in circuit complexity and a drop in processing speed. In addition, the error correction ability may not be satisfactory.

When a secure memory is implemented in an SoC, it is preferable to easily and reliably perform tasks such as writing data, checking data, and correcting error at the time of chip tests prior to shipment. The error detection and correction mechanism as noted above may thus not be a preferable data check means to be used for a secure memory in an SoC. Related arts are described in Japanese Patent Application Publication No. 10-314451, Japanese Patent Application Publication No. 04-168700, Japanese Patent Application Publication No. 01-118933 and Japanese Patent Application Publication No. 01-279344.

SUMMARY

According to an aspect of the embodiment, a semiconductor device includes a nonvolatile memory adapted to store write data in a write-enabled state, a check circuit configured to enable the write data as data for comparison in response to an enabled-status indicating signal indicative of the write-enabled state and to output a result of comparison obtained by comparing data read from the nonvolatile memory with the enabled data for comparison, and a path configured to output the result of comparison output from the check circuit to outside the semiconductor device, wherein no path to output the data read from the nonvolatile memory to outside the semiconductor device is in existence.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In the following, embodiments of the present invention will be described in detail with reference to the accompanying drawings.

It may be preferable to provide a semiconductor device that may satisfy both the requirement to prohibit the data stored in memory from being read and the requirement to allow the stored data to be checked.

Figure 1:
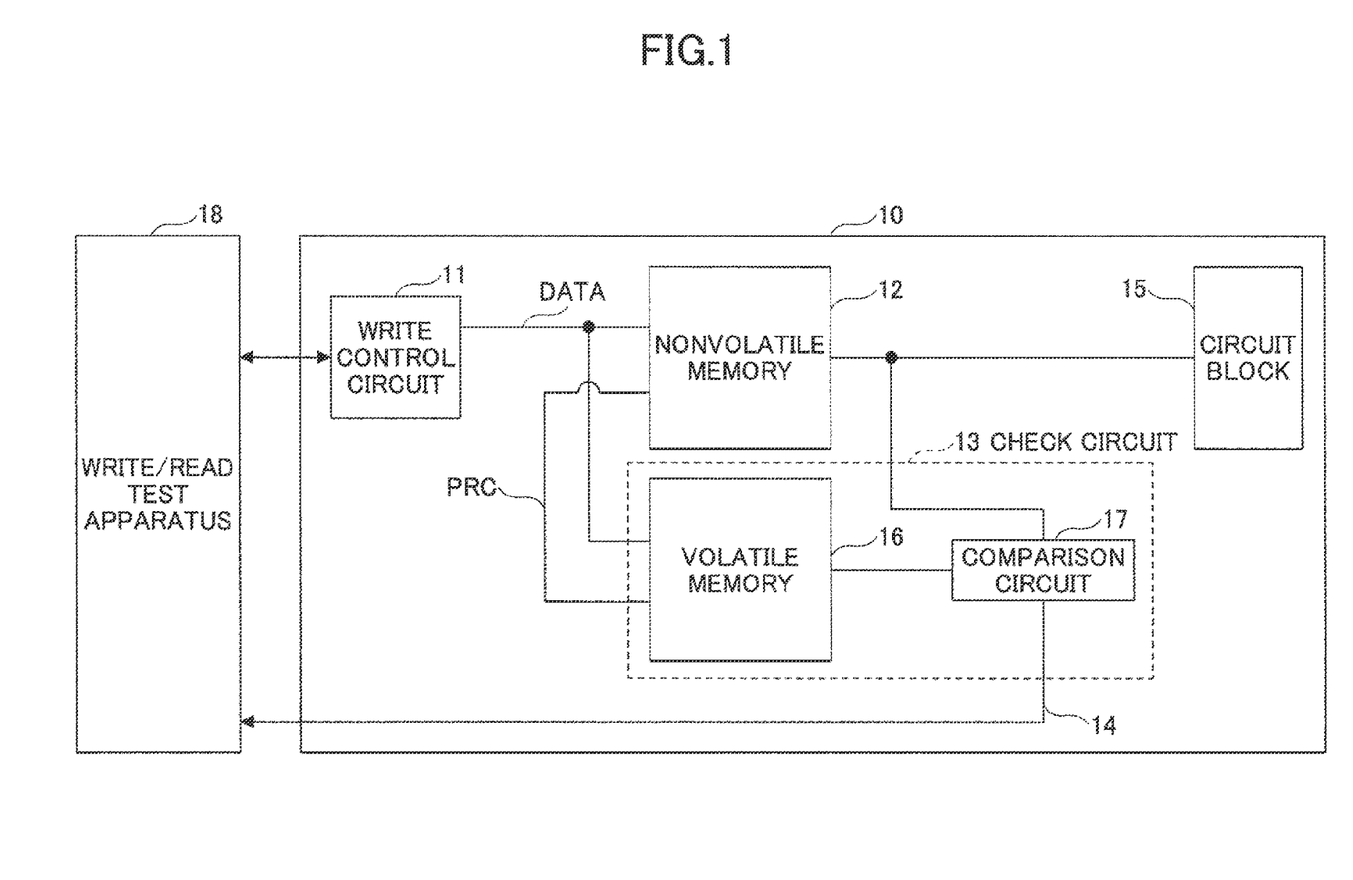
FIG. 1 is a drawing showing a schematic configuration of a semiconductor device according to a present embodiment.

FIG. 1 is a drawing showing a schematic configuration of a semiconductor device according to a present embodiment. A semiconductor device 10 illustrated in FIG. 1 is a single semiconductor chip such as an SoC, and includes a write control circuit 11, a nonvolatile memory 12, a check circuit 13, a comparison result outputting path 14, and a circuit block 15. The semiconductor device 10 is coupled to an external write/read test apparatus 18. The write/read test apparatus 18 is used to operate the semiconductor device 10 to conduct a test with respect to the semiconductor device 10. Specifically, data is written to the nonvolatile memory 12 of the semiconductor device 10, and a check is made as to whether the data is correctly written.

In the semiconductor device 10, the nonvolatile memory 12 is a secure memory that is configured to protect the security of its stored data contents. Namely, the semiconductor device 10 has no path to output data read from the nonvolatile memory 12 to an external apparatus. The data paths for data read from the nonvolatile memory 12 include a path leading to the circuit block 15 that uses the data for the originally intended operation of the semiconductor device 10 and a path leading to the check circuit 13 that checks whether there is an error in the data stored in the nonvolatile memory 12. The circuit block 15 is provided inside the semiconductor device 10 that is a single semiconductor chip, so that the security of data is protected along the path extending from the nonvolatile memory 12 to the circuit block 15. The semiconductor device 10 may be a decoder for decoding image and audio data, for example, which performs a data decoding process by use of the circuit block 15 based on a decode key (i.e., encryption key) stored in the nonvolatile memory 12. The circuit block 15 may alternatively be provided outside the semiconductor device 10. Such a configuration is viable if an encryption circuit and a decryption circuit are provided on the path extending from the nonvolatile memory 12 to the circuit block 15. In this configuration, data read from the nonvolatile memory 12 is not supplied to an exterior path as it is, but is encrypted before it is output to the exterior path.

An enabled-status indicating signal PRC serves to indicate the enabled status of a write operation performed with respect to the nonvolatile memory 12, and is supplied to the check circuit 13. The enabled-status indicating signal PRC may be a signal for setting the nonvolatile memory 12 to a write operation enabled state, or may be a signal indicating that the nonvolatile memory 12 is placed in a write operation enabled state. The enabled-status indicating signal PRC may be a signal supplied from an external source to the nonvolatile memory 12, or may be a signal generated by the nonvolatile memory 12.

The write control circuit 11 outputs write data DATA. The write data DATA output from the write control circuit 11 is supplied to the nonvolatile memory 12 and the check circuit 13. The write data DATA is written to the nonvolatile memory 12 when it is in the write-operation-enabled state. The check circuit 13 enables the write data DATA as data for comparison in response to the enabled-status indicating signal PRC, and outputs the result of comparison obtained by comparing the data read from the nonvolatile memory 12 with the enabled data for comparison. The result of comparison output from the check circuit 13 is output to outside the semiconductor device 10 through the comparison result outputting path 14 for provision to the write/read test apparatus 18. The result of comparison output by the check circuit 13 may indicate a match or mismatch (i.e., consistency or inconsistency) with respect to each data bit.

The check circuit 13 may include a volatile memory 16 and a comparison circuit 17. The write data DATA is written to the volatile memory 16 as data for comparison in response to the enabled-status indicating signal PRC. The comparison circuit 17 outputs the result of comparison obtained by comparing the data read from the nonvolatile memory 12 with the data read from the volatile memory 16. The operation that writes the write data DATA as data for comparison to the volatile memory 16 in response to the enabled-status indicating signal PRC corresponds to the operation that enables the write data DATA as data for comparison, i.e., the operation that makes the write data DATA available as data for comparison.

In this configuration, the write operation with respect to the volatile memory 16 is controlled by the enabled-status indicating signal PRC. It is thus impossible to write data to the volatile memory 16 without writing data to the nonvolatile memory 12. Namely, when data is written to the volatile memory 16, the same data as this data is always written to the nonvolatile memory 12. An unacceptable configuration would be such that data could be written only to the volatile memory 16. If such an operation was allowed, the writing of all "1" data to the volatile memory 16, for example, would easily reveal the data stored in the nonvolatile memory 12 by analyzing the result of comparison output from the comparison circuit 17. In order to avoid this, the semiconductor device 10 of FIG. 1 is configured such that writing data only to the volatile memory 16 is not possible.

Alternatively, a configuration in which no memory is provided in the check circuit 13 may properly work, as will be described later. For example, a path whose data transmission or blockage is controlled in response to the enabled-status indicating signal PRC may be provided, so that the write data DATA is supplied to the comparison circuit in response to an asserted state (i.e., a state indicative of an enabled state) of the enabled-status indicating signal PRC. The operation that supplies the write data DATA to the comparison circuit in response to the enabled-status indicating signal PRC corresponds to the operation that enables the write data DATA as data for comparison, i.e., the operation that makes the write data DATA available as data for comparison. The nonvolatile memory 12 may be such a memory device that data output is available immediately after data is written. In such a case, the data output from the nonvolatile memory 12 may be compared with the write data DATA supplied in response to the enabled-status indicating signal PRC to output the result of comparison.

In this manner, the check circuit 13 outputs the result of comparison obtained by comparing the data stored in the nonvolatile memory 12 with the enabled data for comparison only when the data written to the nonvolatile memory 12 is enabled as data for comparison by the enabled-status indicating signal PRC. The semiconductor device 10 has no path to output data retrieved from the nonvolatile memory 12 to an external apparatus, and, further, may output the result of comparison only with respect to the data that is enabled by a write operation for writing data to the nonvolatile memory 12. Accordingly, it is possible to protect the security of data stored in the nonvolatile memory 12 and also to check from outside whether the data written to the nonvolatile memory 12 is correctly stored. Moreover, the result of comparison indicates a match or mismatch separately for each bit (i.e., on a bit-by-bit basis), so that the position of a failed bit may be detected and subjected to redundancy processing as such a need arises.

In the semiconductor device 10, the comparison result outputting path 14 may serve as a path for outputting data read from the volatile memory 16 to outside the semiconductor device 10. Namely, provision may be made such that the data read from the volatile memory 16 may be output to outside the semiconductor device 10 via the comparison result outputting path 14 without any data change. With this provision, the fact that the data for comparison as stored in the volatile memory is identical to the write data, i.e., the fact that data writing with respect to the volatile memory 16 is correctly performed, may be easily confirmed. It should be noted that the data contents of the volatile memory 16 are erased once the power is turned off. The semiconductor device 10 may be powered off after the correctness of data written to the nonvolatile memory 12 is checked by use of the check circuit 13. Such power-off serves to erase the data stored in the volatile memory 16. Even when there is a path for outputting the data of the volatile memory 16 to outside the semiconductor device 10, the security of data contents of the nonvolatile memory 12 may be protected.

In the semiconductor device 10, a check-purpose nonvolatile memory to which the write data DATA is written as data for comparison in response to the enabled-status indicating signal PRC may be provided in place of the volatile memory 16. With this configuration, a path for outputting data read from this check-purpose memory may be provided. In such a case, provision may be made such that the data contents of the check-purpose memory are automatically erased after checking the correctness of data written to the nonvolatile memory 12. If the configuration is such that the data read from the check-purpose memory may not be output to outside the semiconductor device 10, the fact that the data is retained in the check-purpose memory does not pose a problem.

Figure 2:
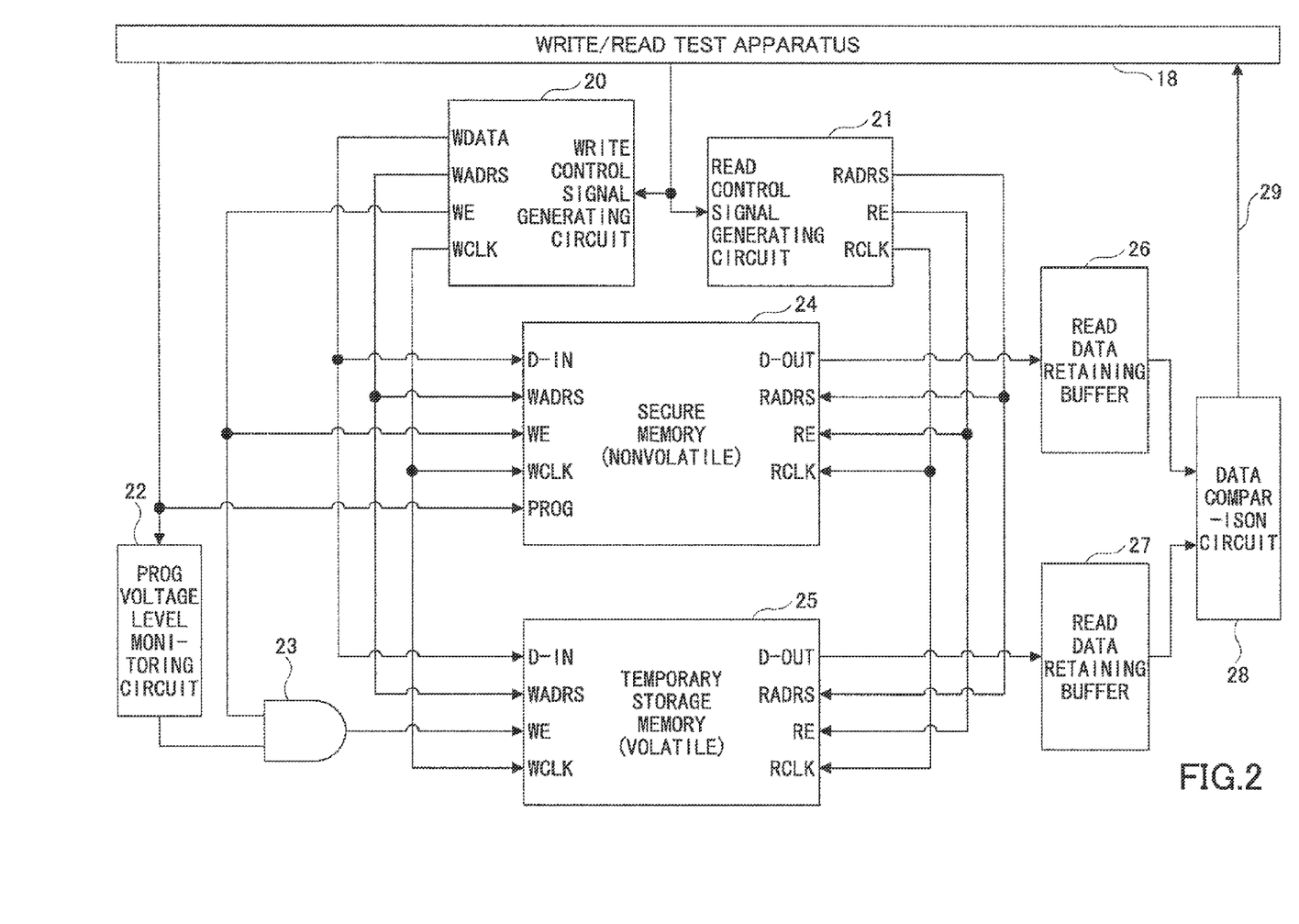
FIG. 2 is a drawing showing an example of the configuration of the semiconductor memory device according to the present embodiment.

FIG. 2 is a drawing showing an example of the configuration of the semiconductor memory device according to the present embodiment. In FIG. 2, a portion corresponding to the circuit block 15 of the semiconductor device 10 illustrated in FIG. 1 is omitted from the illustration. The semiconductor device illustrated in FIG. 2 includes a write control signal generating circuit 20, a read control signal generating circuit 21, a PROG voltage level monitoring circuit 22, an AND gate 23, a nonvolatile secure memory 24, a volatile temporary storage memory 25, a read data retaining buffer 26 that is a flip-flop, a read data retaining buffer 27 that is a flip-flop, a data comparison circuit 28, and a comparison result outputting path 29.

The write control signal generating circuit 20, the PROG voltage level monitoring circuit 22, and the AND gate 23 correspond to the write control circuit 11 illustrated in FIG. 1. The secure memory 24 corresponds to the nonvolatile memory 12 illustrated in FIG. 1. The temporary storage memory 25, the read data retaining buffer 26, the read data retaining buffer 27, and the data comparison circuit 28 correspond to the check circuit 13 illustrated in FIG. 1. More specifically, the temporary storage memory 25 corresponds to the volatile memory 16, and the data comparison circuit 28 corresponds to the comparison circuit 17.

Upon receiving a write request, write data, and a write address from the write/read test apparatus 18, the write control signal generating circuit 20 asserts a write enable signal WE, and outputs write data WDATA and a write address WADRS. The write control signal generating circuit 20 also outputs a write clock signal WCLK as a write synchronizing signal. The write enable signal WE, the write data WDATA, the write address WADRS, and the write clock signal WCLK output from the write control signal generating circuit 20 are supplied to the secure memory 24 as the write enable signal WE, input data D-IN, the write address WADRS, and the write clock signal WCLK. Further, the write data WDATA, the write address WADRS, and the write clock signal WCLK output from the write control signal generating circuit 20 are supplied to the temporary storage memory 25 as input data D-IN, the write address WADRS, and the write clock signal WCLK.

The write enable signal WE output from the write control signal generating circuit 20 is supplied to one of the input terminals of the AND gate 23. The other input terminal of the AND gate 23 receives the output of the PROG voltage level monitoring circuit 22. The PROG voltage level monitoring circuit 22 receives at its input an enabled-status indicating signal PROG, which is supplied from the write/read test apparatus 18 to enable the write operation (i.e., program operation) of the secure memory 24. The enabled-status indicating signal PROG corresponds to the enabled-status indicating signal PRC illustrated in FIG. 1. The enabled-status indicating signal PROG is also supplied to the secure memory 24. The secure memory 24 may perform a write operation (i.e., program operation) only when the enabled-status indicating signal PROG is set equal to a write voltage (i.e., program voltage). The PROG voltage level monitoring circuit 22 monitors the voltage of the enabled-status indicating signal PROG. When the voltage of the enabled-status indicating signal PROG becomes the write voltage, the PROG voltage level monitoring circuit 22 changes its output to the asserted state (e.g., HIGH in this example).

When the output of the PROG voltage level monitoring circuit 22 becomes HIGH and the write enable signal WE from the write control signal generating circuit 20 becomes the asserted state (e.g., HIGH in this example), the output of the AND gate 23 is changed to HIGH. Namely, the write enable signal WE for the temporary storage memory 25 is changed to the asserted state.

Accordingly, the temporary storage memory 25 stores the write data when the write enable signal WE supplied to the secure memory 24 is in the asserted state and when the enabled-status indicating signal PROG is set to the program voltage. In other words, the temporary storage memory 25 enables the write data as data for comparison in response to the enabled-status indicating signal PROG indicative of the enabled status of the write operation of the secure memory 24 and the assertion of the write enable signal WE. The use of the write-enable signal WE in addition to the enabled-status indicating signal PROG for the purpose of controlling writing to the temporary storage memory 25 ensures that writing data to the temporary storage memory 25 is performed only when writing data to the secure memory 24 is actually performed.

The secure memory 24 may have such a configuration that the write data WDATA is written to the secure memory 24 only in response to the application of the write voltage of the enabled-status indicating signal PROG without requiring the write-enable signal WE. In such a case, there is no need to use the write-enable signal WE for the purpose of controlling writing to the temporary storage memory 25. In the configuration illustrated in FIG. 2, the write operation of the secure memory 24 is enabled in response to the concurrent occurrences of both the asserted state of the write-enable signal WE and the enabled state of the enabled-status indicating signal PROG. In such a case, a signal indicative of concurrent occurrences of these states may be regarded as a signal corresponding to the enabled-status indicating signal PRC illustrated in FIG. 1. Namely, a state of a single signal or of the combination of plural signals corresponding to the logic PROG&WE may be regarded as the enabled-status indicating signal PRC.

Figure 3:
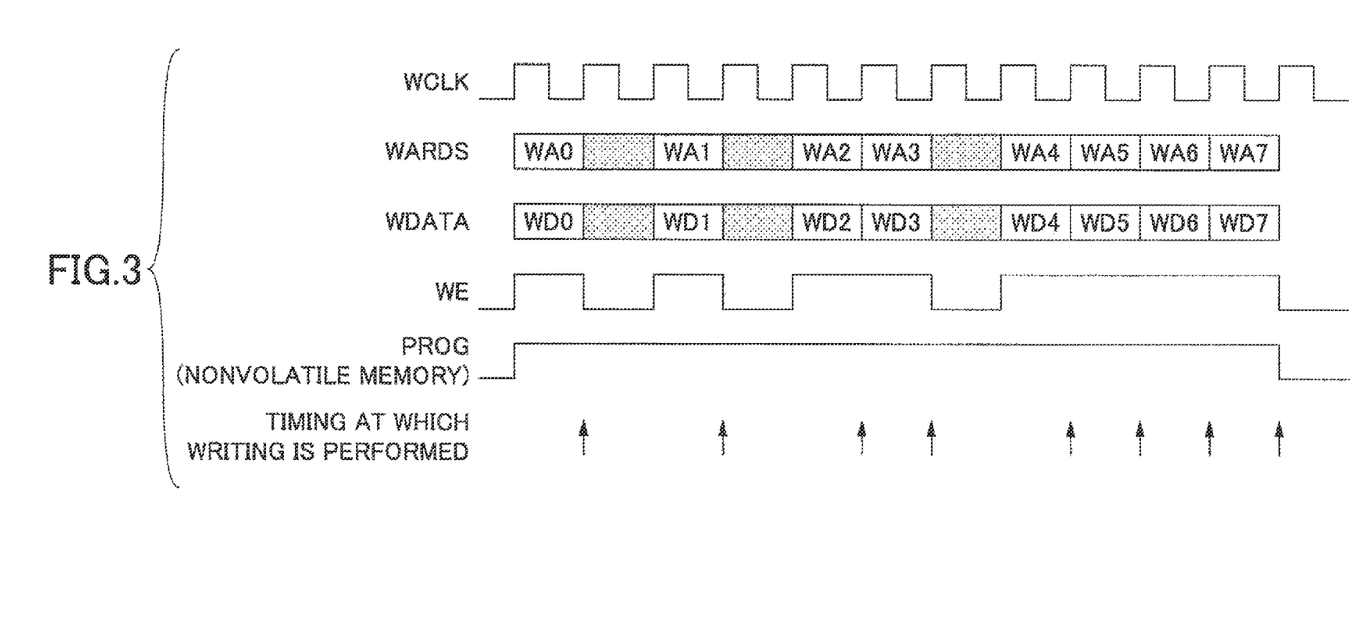
FIG. 3 is a drawing illustrating signals relating to a write operation in the semiconductor device illustrated in FIG. 2.

FIG. 3 is a drawing illustrating signals relating to a write operation in the semiconductor device illustrated in FIG. 2. As illustrated in FIG. 3, the write control signal generating circuit 20 asserts the write-enable signal WE and supplies the write address WARDS and the write data WDATA in synchronization with the write clock signal WCLK. During the write operation, the enabled-status indicating signal PROG (i.e., program voltage) supplied from the write/read test apparatus 18 is equal to a predetermined write voltage. At the timings indicated by arrows illustrated at the bottom of FIG. 3, data are written to the secure memory 24 and the temporary storage memory 25. In general, the time length required to write data differs between the nonvolatile secure memory 24 and the volatile temporary storage memory 25. In such a case, the write control signal generating circuit 20 controls the secure memory 24 and the temporary storage memory 25 independently of each other according to need.

Referring to FIG. 2 again, the read control signal generating circuit 21 receives a read request and a read address to assert a read-enable signal RE and output a read address RADRS. The read control signal generating circuit 21 also outputs a read clock signal RCLK as a read synchronizing signal. The read-enable signal RE, the read address RADRS, and the read clock signal RCLK are supplied to each of the secure memory 24 and the temporary storage memory 25. In response, the secure memory 24 and the temporary storage memory 25 output the stored data, which are then stored in the read data retaining buffer 26 and the read data retaining buffer 27, respectively. The data stored in the read data retaining buffer 26 and the read data retaining buffer 27 are compared with each other by the data comparison circuit 28. Data indicative of the result of the comparison is then supplied via the comparison result outputting path 29 to the write/read test apparatus 18.

Figure 4:
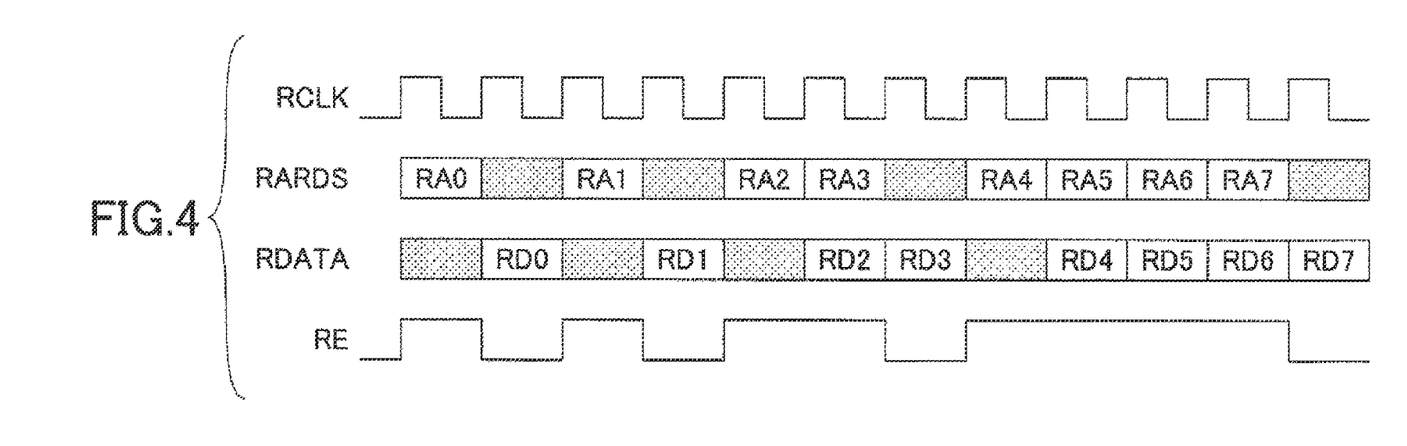
FIG. 4 is a drawing illustrating signals relating to a read operation in the semiconductor device illustrated in FIG. 2.

FIG. 4 is a drawing illustrating signals relating to a read operation in the semiconductor device illustrated in FIG. 2. As illustrated in FIG. 4, the read control signal generating circuit 21 asserts the read-enable signal RE and supplies the read address RARDS in synchronization with the read clock signal RCLK. In response to the asserted read-enable signal RE and the read address RARDS, the secure memory 24 and the temporary storage memory 25 output read data, respectively. These read data are compared by the data comparison circuit 28 as was previously described.

In the following, a description will be given of a configuration used when the memory volume of the volatile memory is smaller than the memory volume of the nonvolatile memory. In the write and read operations illustrated in FIG. 3 and FIG. 4, it is assumed that the storage volume of the secure memory 24 and the storage volume of the temporary storage memory 25 are the same. Namely, data are written to a plurality of addresses as many as desired as shown in FIG. 3, and, then, these data are read from these addresses as shown in FIG. 4, followed by performing data comparison separately for each read operation. Instead of using such a configuration, the memory volume of the volatile memory may be made smaller than the memory volume of the nonvolatile memory. For example, the memory volume of the volatile memory is set equal to the data size that is written by a single write operation. With this configuration, the circuit size and cost of the volatile memory may be significantly reduced.

Figure 5:
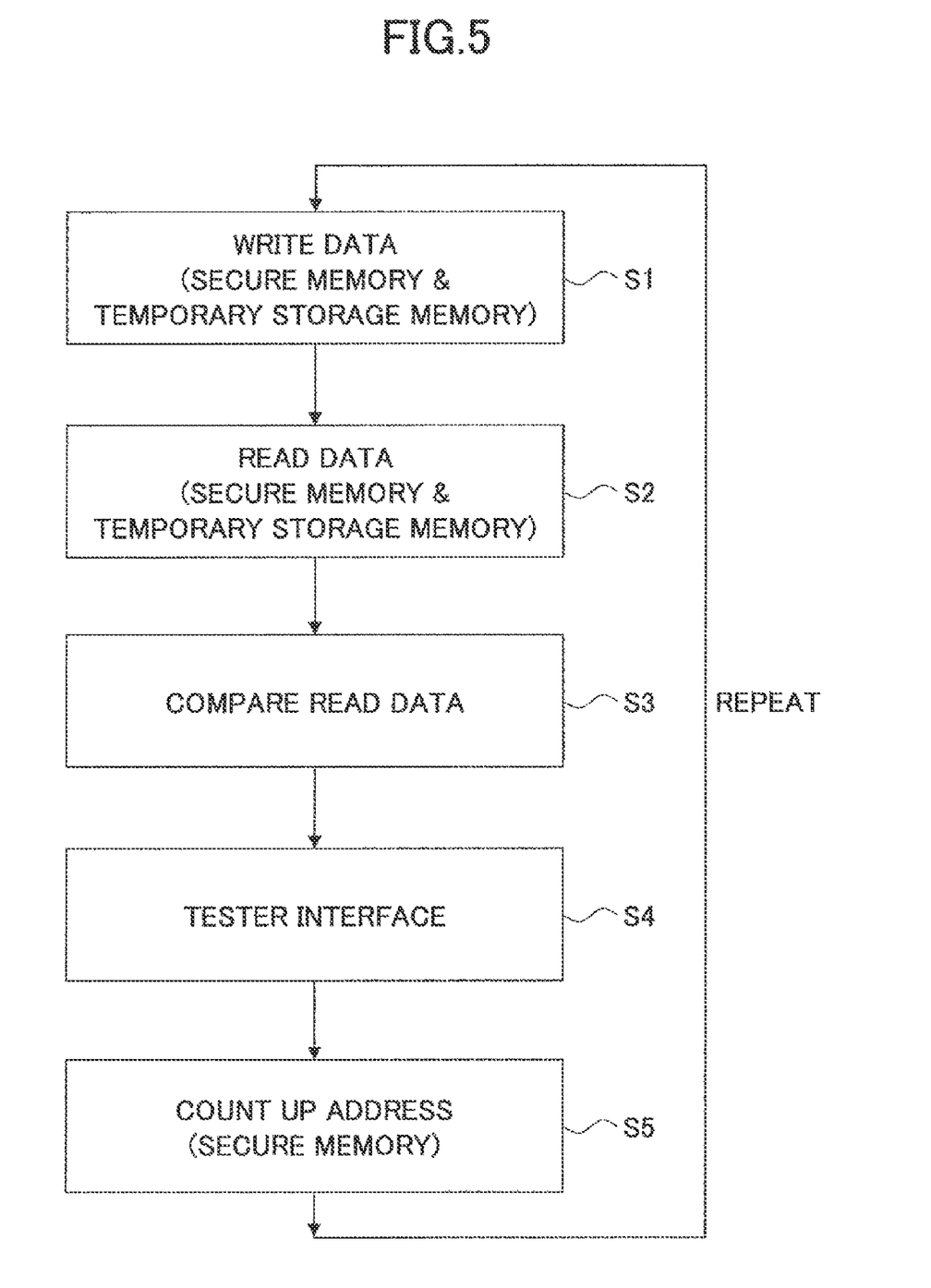
FIG. 5 is a flowchart showing a sequence of a write operation, a read operation, and a data comparison operation performed when the memory volume of a volatile memory is smaller than the memory volume of a nonvolatile memory.

FIG. 5 is a flowchart showing a sequence of a write operation, a read operation, and a data comparison operation performed when the memory volume of a volatile memory is smaller than the memory volume of a nonvolatile memory. In step S1, data writing is performed with respect to an address in the secure memory and an address in the temporary storage memory. In step S2, data are read from the above-noted address in the secure memory and the above-noted address in the temporary storage memory. In step S3, the read data are compared with each other. In step S4, the result of comparison is supplied to the tester (i.e., write/read test apparatus) via the comparison result outputting path (i.e., tester interface). In step S5, the address values stored in registers or the like are incremented to values indicative of next addresses. Thereafter, the procedure goes back to step S1 to repeat the subsequent steps, thereby performing data write, data read, and data comparison with respect to the next addresses. The operation described above is repeated until no write data remains.

As described above, provision may be made such that the result of comparison obtained by comparing data read from the nonvolatile memory and data read from the volatile memory is output each time data is written to the nonvolatile memory. With such arrangement, the memory volume of the volatile memory may be made smaller than the memory volume of the nonvolatile memory.

Figure 6:
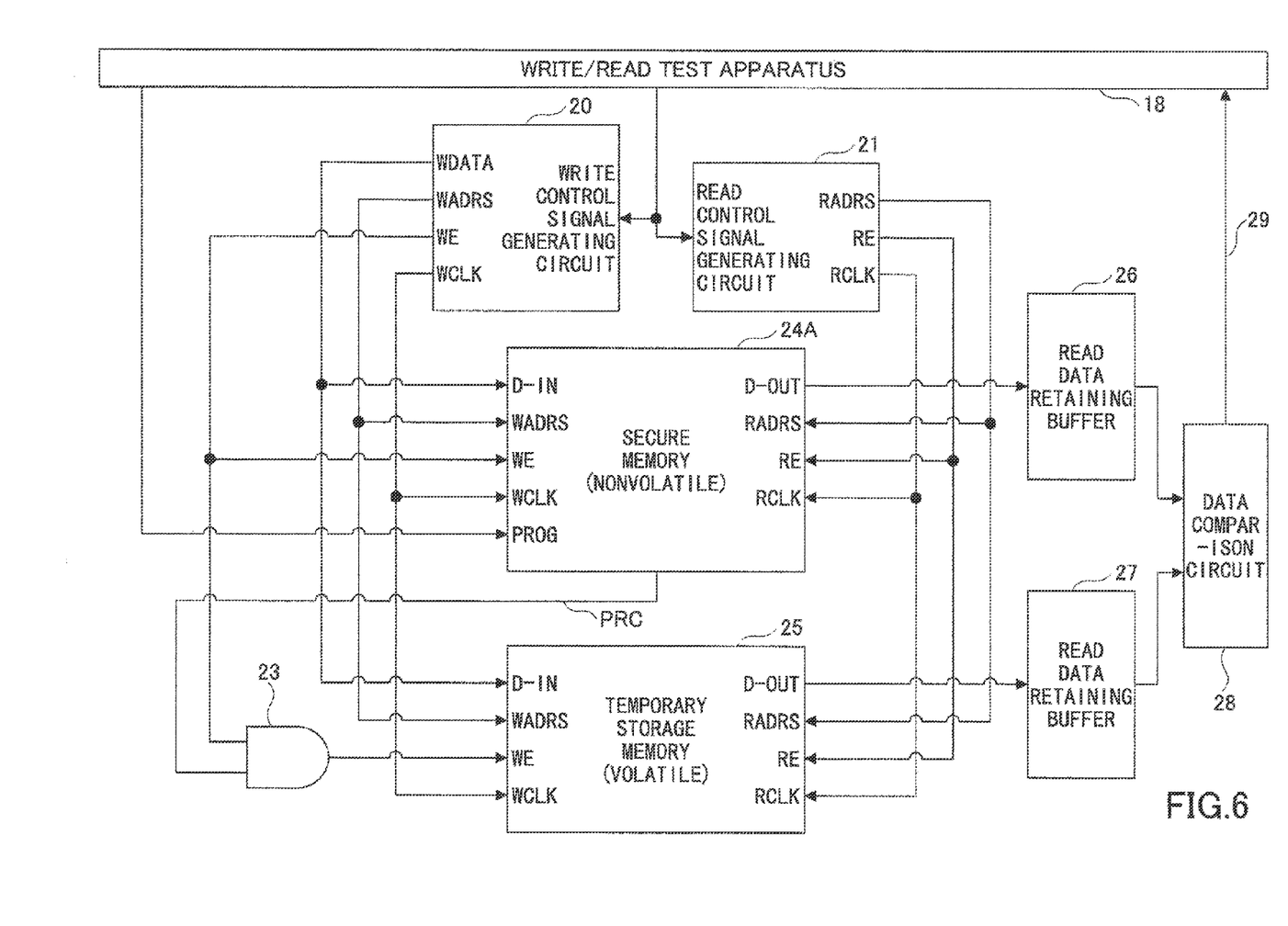
FIG. 6 is a drawing showing another example of the configuration of the semiconductor memory device according to the present embodiment.

FIG. 6 is a drawing showing another example of the configuration of the semiconductor memory device according to the present embodiment. In FIG. 6, the same elements as those of FIG. 2 are referred to by the same numerals, and a description thereof will be omitted.

The configuration illustrated in FIG. 6 differs from the configuration illustrated in FIG. 2 in that the PROG voltage level monitoring circuit 22 is removed and that a secure memory 24A is provided in place of the secure memory 24. Other parts and aspects of the configuration and operation are the same between FIG. 2 and FIG. 6. The secure memory 24A sets the enabled-status indicating signal PRC to HIGH when the program voltage PROG is equal to a proper write voltage. The enabled-status indicating signal PRC is supplied to one of the input terminals of the AND gate 23. The other input terminal of the AND gate 23 receives the write-enable signal WE output from the write control signal generating circuit 20.

Accordingly, the temporary storage memory 25 stores the write data when the write-enable signal WE supplied to the secure memory 24A is in the asserted state and when the enabled-status indicating signal PRC indicates the proper program voltage state of the secure memory 24A. In other words, the temporary storage memory 25 enables the write data as data for comparison in response to the enabled-status indicating signal PRC indicative of the enabled status of the write operation of the secure memory 24A and the assertion of the write enable signal WE. The use of the write-enable signal WE in addition to the enabled-status indicating signal PRC for the purpose of controlling writing to the temporary storage memory 25 ensures that writing data to the temporary storage memory 25 is performed only when writing data to the secure memory 24A is actually performed.

Figure 7:
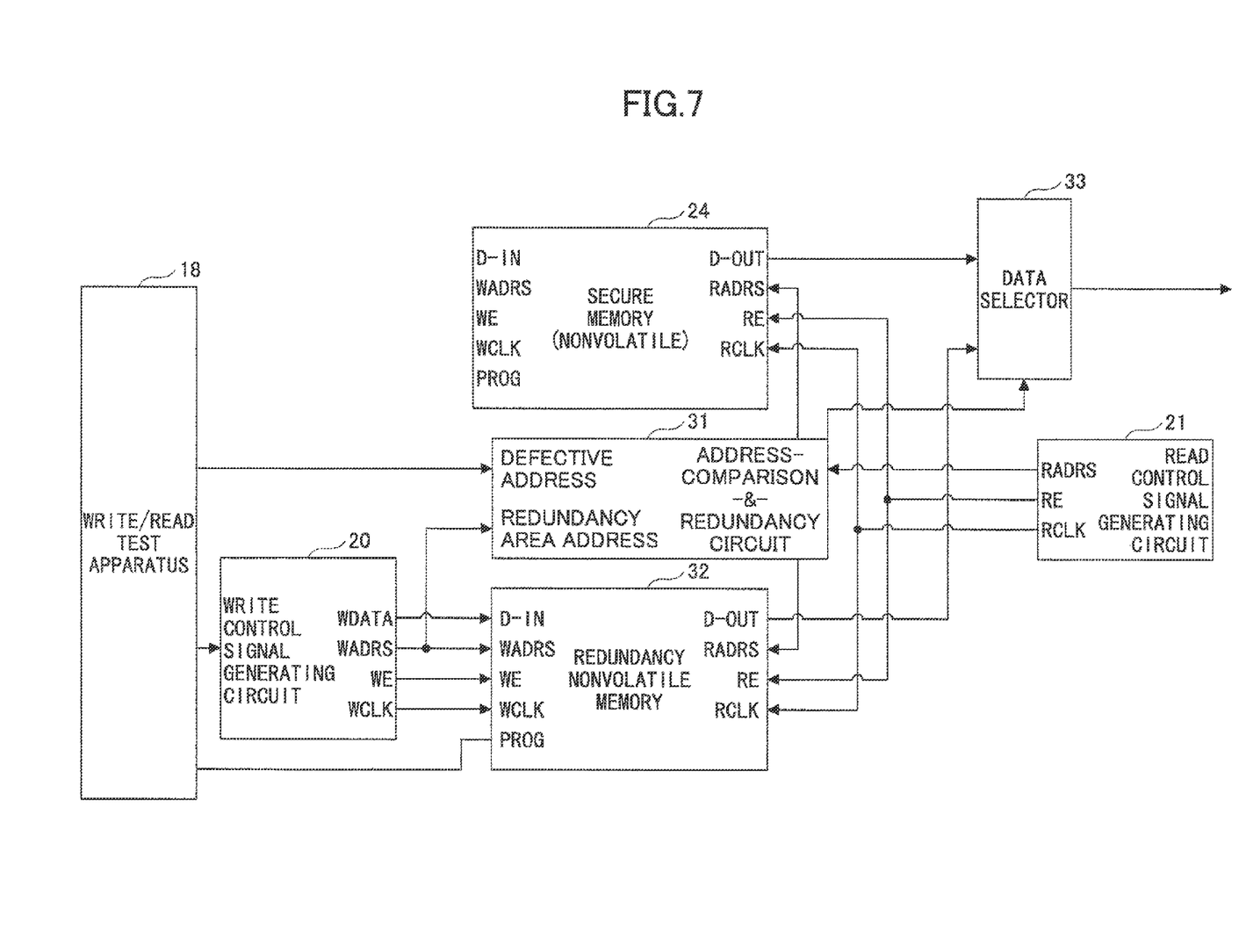
FIG. 7 is a drawing showing an example of the configuration that performs a redundancy operation for the nonvolatile memory.

FIG. 7 is a drawing showing an example of the configuration that performs a redundancy operation for the nonvolatile memory. In FIG. 7, the same elements as those of FIG. 2 are referred to by the same numerals, and a description thereof will be omitted. For the sake of simplicity of illustration, signal couplings from the write control signal generating circuit 20 to the secure memory 24 are omitted from the illustration.

As illustrated in FIG. 7, the write enable signal WE, the write data WDATA, the write address WADRS, and the write clock signal WCLK output from the write control signal generating circuit 20 are supplied to a redundancy nonvolatile memory 32 as the write enable signal WE, input data D-IN, the write address WADRS, and the write clock signal WCLK. Further, the write address WADRS output from the write control signal generating circuit 20 is supplied to an address-comparison-&-redundancy circuit 31.

As was described in connection with FIG. 2, the write/read test apparatus 18 may identify a defective address in the secure memory 24 based on the result of comparison that is supplied to the write/read test apparatus 18 from the data comparison circuit 28 via the comparison result outputting path 29. The write/read test apparatus 18 registers such an identified defective address in the address-comparison-&-redundancy circuit 31 as a failure address, i.e., registers the defective address in a register provided inside the address-comparison-&-redundancy circuit 31. In addition to registering the defective address, the write/read test apparatus 18 writes write data to the redundancy nonvolatile memory 32 at a properly selected address wherein this write data was supposed to be originally written to the defective address in the secure memory 24. The write address WADRS of the redundancy nonvolatile memory 32 is supplied to the address-comparison-&-redundancy circuit 31. The address-comparison-&-redundancy circuit 31 registers the defective address and the redundancy area address (i.e., stores them in an internal register) in such a manner that these addresses are associated with each other.

When a data read operation is performed, the read control signal generating circuit 21 supplies the read-enable signal RE and the read clock signal RCLK to each of the secure memory 24 and the redundancy nonvolatile memory 32. Further, the read control signal generating circuit 21 supplies a read address RADRS to the address-comparison-&-redundancy circuit 31. The address-comparison-&-redundancy circuit 31 compares the read address RADRS with the registered defective addresses. When the read address RADRS does not match any one of the registered defective addresses, the address-comparison-&-redundancy circuit 31 supplies the read address RADRS to the secure memory 24, and causes a data selector 33 to select the read data output from the secure memory 24. When the read address RADRS matches one of the registered defective addresses, the address-comparison-&-redundancy circuit 31 supplies a redundancy area address corresponding to the matched one of the registered defective addresses to the redundancy nonvolatile memory 32, and causes the data selector 33 to select the read data output from the redundancy nonvolatile memory 32.

In this manner, a redundancy function is implemented by providing the redundancy nonvolatile memory 32, the address comparison circuit (i.e., address-comparison-&-redundancy circuit 31) for comparing a read address with defective addresses, and the data selector 33 for selecting one of the read data output from the secure memory 24 and the read data output from the redundancy nonvolatile memory 32 in response to the result of comparison made by the address comparison circuit. The above-noted configuration has been described as a redundancy function with respect to the configuration illustrated in FIG. 2. By the same token, a redundancy function may be implemented in the same manner with respect to the configuration illustrated in FIG. 6.

Figure 8:
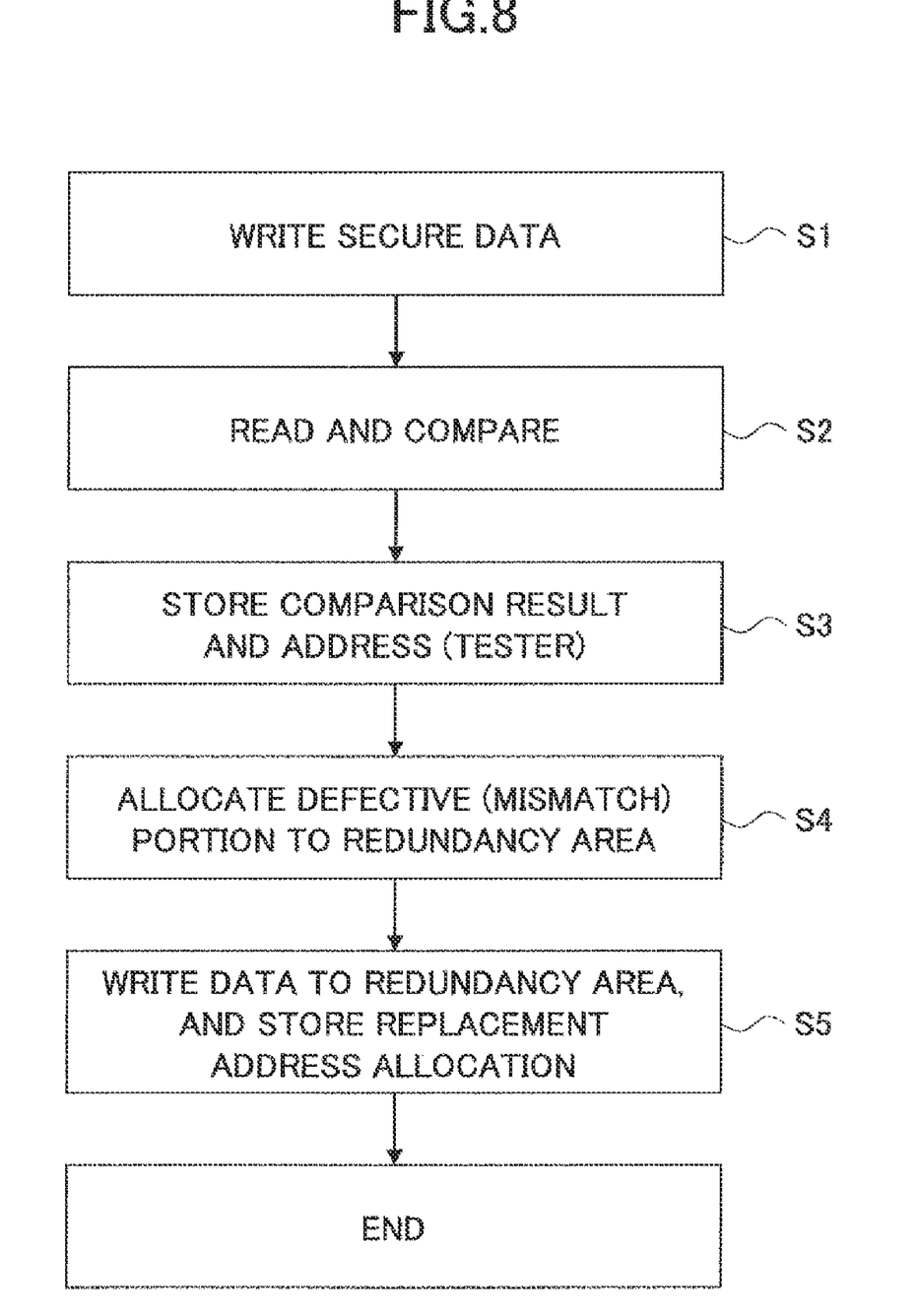
FIG. 8 is a flowchart showing the operation of the semiconductor device illustrated in FIG. 7.

FIG. 8 is a flowchart showing the operation of the semiconductor device illustrated in FIG. 7. In step S1, data is written to the secure memory 24. In step S2, data are read from the secure memory 24 and the temporary storage memory 25 for comparison with each other. In step S3, the result of comparison is supplied to the write/read test apparatus 18. If the result of comparison indicates an error, the defective address is registered. In step S4, a redundancy area address in the redundancy nonvolatile memory 32 for replacing the defective address in the secure memory 24 is determined. In step S4, the data is written to the redundancy nonvolatile memory 32 at the redundancy area address, and, also, the redundancy area address and the defective address are registered in the address-comparison-&-redundancy circuit 31 in such a manner that these addresses are associated with each other.

Figure 9:
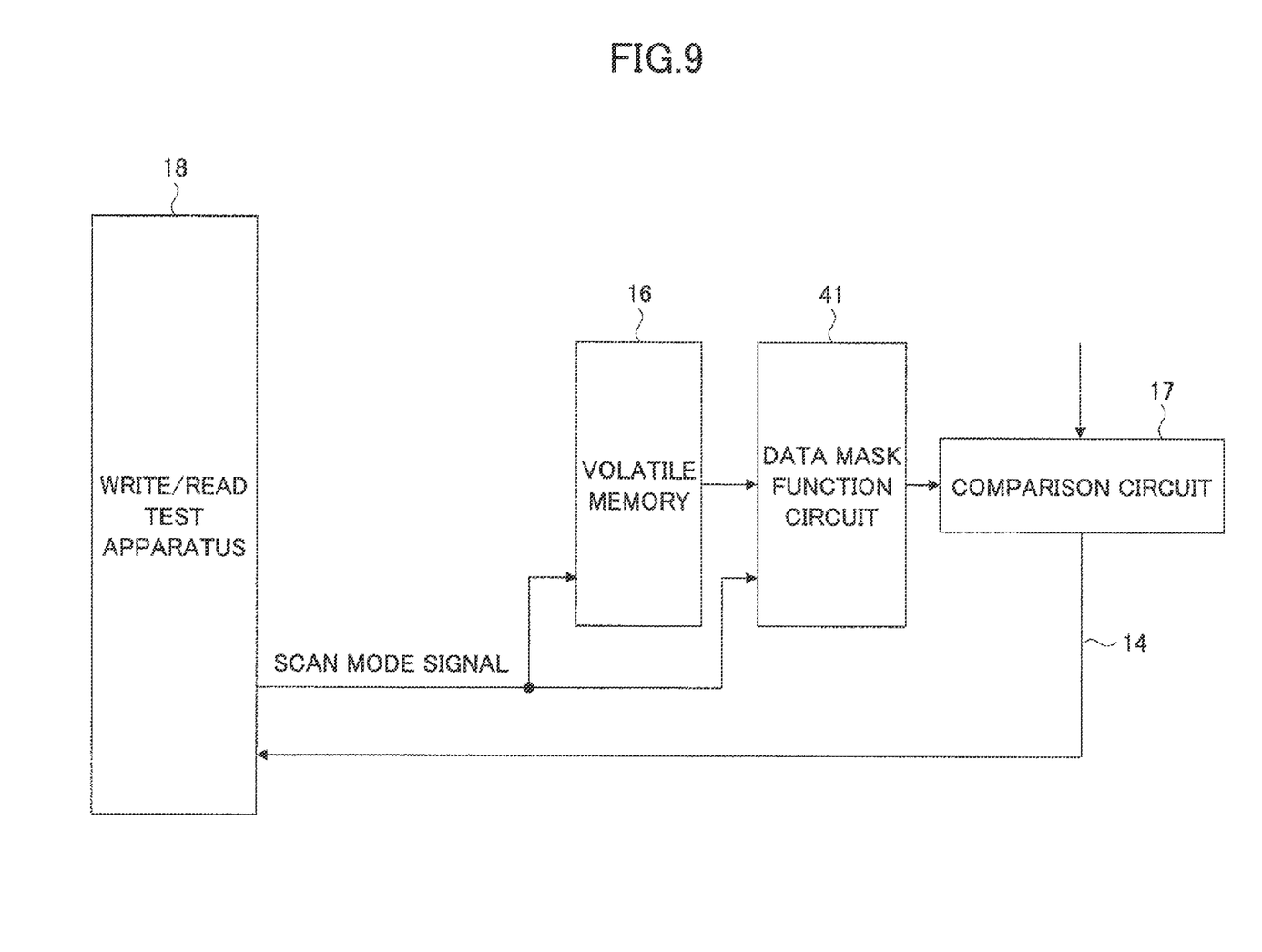
FIG. 9 is a drawing for explaining the test function of the volatile memory.

FIG. 9 is a drawing for explaining the test function of the volatile memory. In FIG. 9, the same elements as those of FIG. 1 are referred to by the same numerals, and a description thereof will be omitted. In the semiconductor device 10 illustrated in FIG. 1, the data stored in the volatile memory 16 is used as data for comparison to detect whether an error exists with respect to the data stored in the nonvolatile memory 12. To this end, it is preferable to check in advance that a data write operation and a data read operation may be correctly performed with respect to the volatile memory 16. It is easy to check the operation of the volatile memory 16 if a path is provided to directly supply the read data output from the volatile memory 16 to outside the semiconductor device. In an SoC or the like, however, it is not preferable to provide dedicated data terminals for outputting data from a memory for the purpose of testing the memory despite the fact that there is no need to directly supply the read data of the memory to outside the chip during routine operations. In consideration of this, an SoC or the like is generally provided with a test function that performs a test by use of a scan chain in a scan mode.

In FIG. 9, the volatile memory 16 has a scan chain embedded therein that includes a plurality of scan flip-flops. Through this scan chain, input data for test purposes are written from the write/read test apparatus 18, and read data are output to the write/read test apparatus 18. A scan mode signal applied to the volatile memory 16 is asserted in the test operation utilizing the scan chain thereby to set the volatile memory 16 in a scan test mode. In the test operation, desired test data may be written to the volatile memory 16 through the scan chain. The data written to the volatile memory 16 are read from the volatile memory 16 via the scan chain, and are then compared with expected values to check whether the volatile memory 16 is correctly operating.

When the volatile memory 16 is set in the scan mode as described above, any desired data may be written to the volatile memory 16 from an external apparatus. Such data may be read from the volatile memory 16 for comparison with data read from the nonvolatile memory 12 by the comparison circuit 17, followed by supplying the result of the comparison to outside the chip. With such a configuration, the security of the nonvolatile memory 12 is undermined. In the configuration in which a test function (i.e., scan test function) for testing the volatile memory 16 is provided, therefore, a data mask function circuit 41 or the like may preferably be provided between the output of the volatile memory 16 and the input of the comparison circuit 17. The data mask function circuit 41 may be implemented by use of NOR gates or the like to mask (i.e., block) data read from the volatile memory 16 in response to the assertion of the scan mode signal. In this manner, the read data is prevented from reaching the comparison circuit 17. The data mask function circuit 41 does not mask (i.e., block) data when the scan mode signal is not asserted, so that data read from the volatile memory 16 is supplied to the comparison circuit 17.

In the configuration described above, a data mask function was used for the purpose of preventing data comparison from being performed in the scan mode. Alternatively, provision may be made to deactivate the comparison circuit 17 in response to the assertion of the scan mode signal, for example, in order to prevent data comparison from being performed in the scan mode. In this manner, any circuit configuration may suffice as long as the comparison circuit 17 is prevented from outputting the result of comparison when the test function of the volatile memory 16 is enabled (i.e., when the scan mode signal is asserted).

Figure 10:
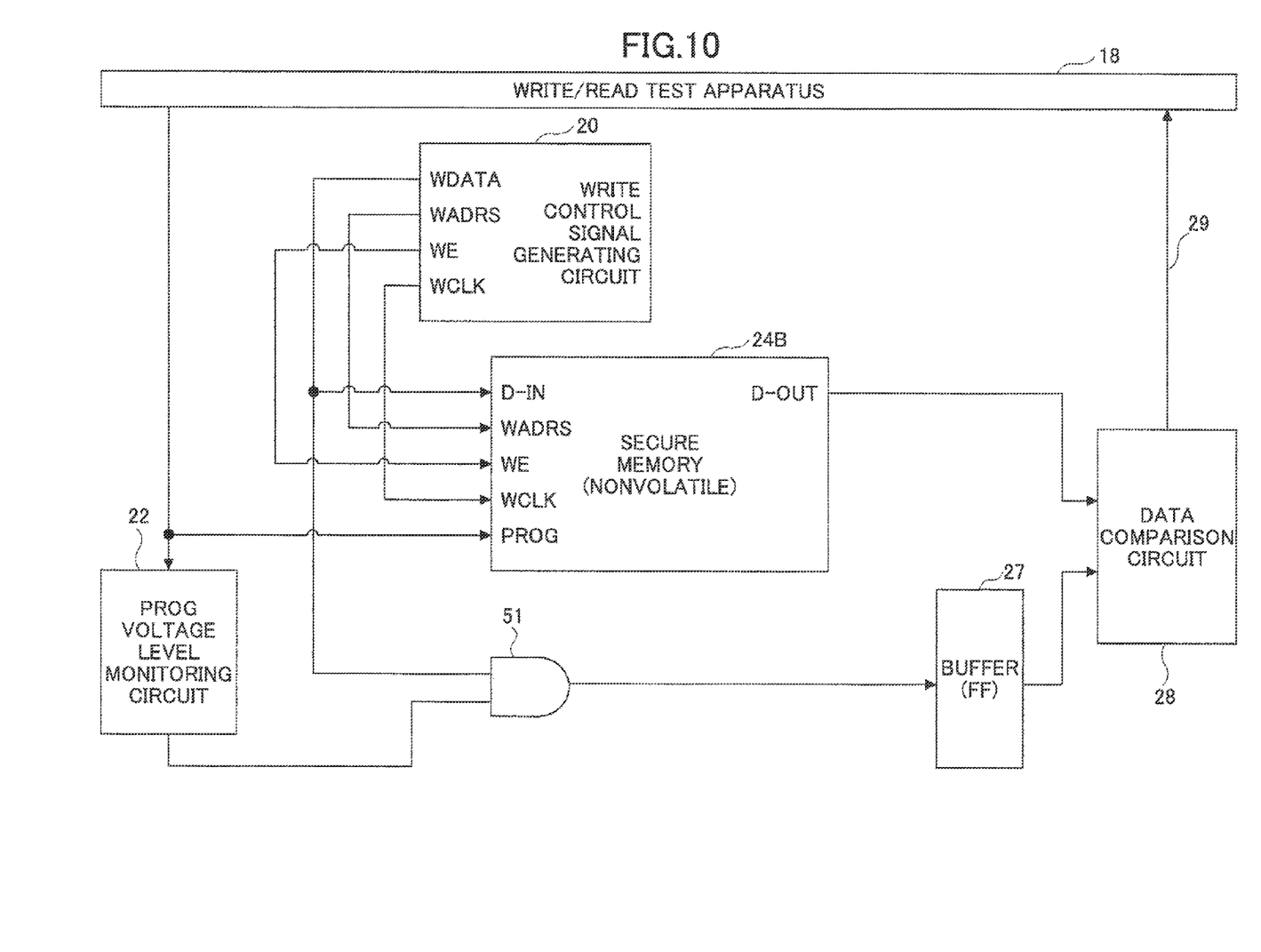
FIG. 10 is a drawing showing yet another example of the configuration of the semiconductor memory device according to the present embodiment.

FIG. 10 is a drawing showing yet another example of the configuration of the semiconductor memory device according to the present embodiment. In FIG. 10, the same elements as those of FIG. 2 are referred to by the same numerals, and a description thereof will be omitted. The configuration illustrated in FIG. 10 differs from the configuration illustrated in FIG. 2 in that a secure memory 24B is provided in place of the secure memory 24 and that an AND circuit 51 is provided after removing the AND gate 23 and the temporary storage memory 25. The AND circuit 51 is implemented by providing an AND gate with respect to each bit of the write data WDATA supplied from the write control signal generating circuit 20, thereby performing an AND operation on a bit-by-bit basis (i.e., separately for each bit).

As previously described, a variation of the semiconductor device illustrated in FIG. 1 in which no memory is provided in the check circuit 13 may properly work. A path whose data transmission or blockage is controlled in response to the enabled-status indicating signal may be provided, so that the write data DATA is supplied to the comparison circuit in response to an asserted state (i.e., a state indicative of an enabled state) of the enabled-status indicating signal. In FIG. 10, the AND circuit 51 corresponds to such a path whose data transmission or blockage is controlled. One input terminal of the AND circuit 51 receives the write data WDATA from the write control signal generating circuit 20. The other input terminal of the AND circuit 51 receives the output of the PROG voltage level monitoring circuit 22. In the same manner as illustrated in FIG. 2, the PROG voltage level monitoring circuit 22 receives at its input an enabled-status indicating signal PROG, which is supplied from the write/read test apparatus 18 to enable the write operation (i.e., program operation) of the secure memory 24.

When the output of the PROG voltage level monitoring circuit 22 becomes HIGH, the AND circuit 51 allows the passage of the write data WDATA from the write control signal generating circuit 20 for provision to the buffer 27. The write data WDATA supplied to the buffer 27 are then applied to the data comparison circuit 28. The operation that supplies the write data WDATA to the comparison circuit in response to the write-voltage state (i.e., a state indicative of the write-enabled condition) of the enabled-status indicating signal PROG corresponds to the operation that enables the write data WDATA as data for comparison, i.e., the operation that makes the write data WDATA available as data for comparison. The secure memory 24B is a memory that may output read data immediately upon data writing. The data comparison circuit 28 compares data read from the secure memory 24B with the write data WDATA supplied via the AND circuit 51 to output the result of the comparison.

Figure 11:
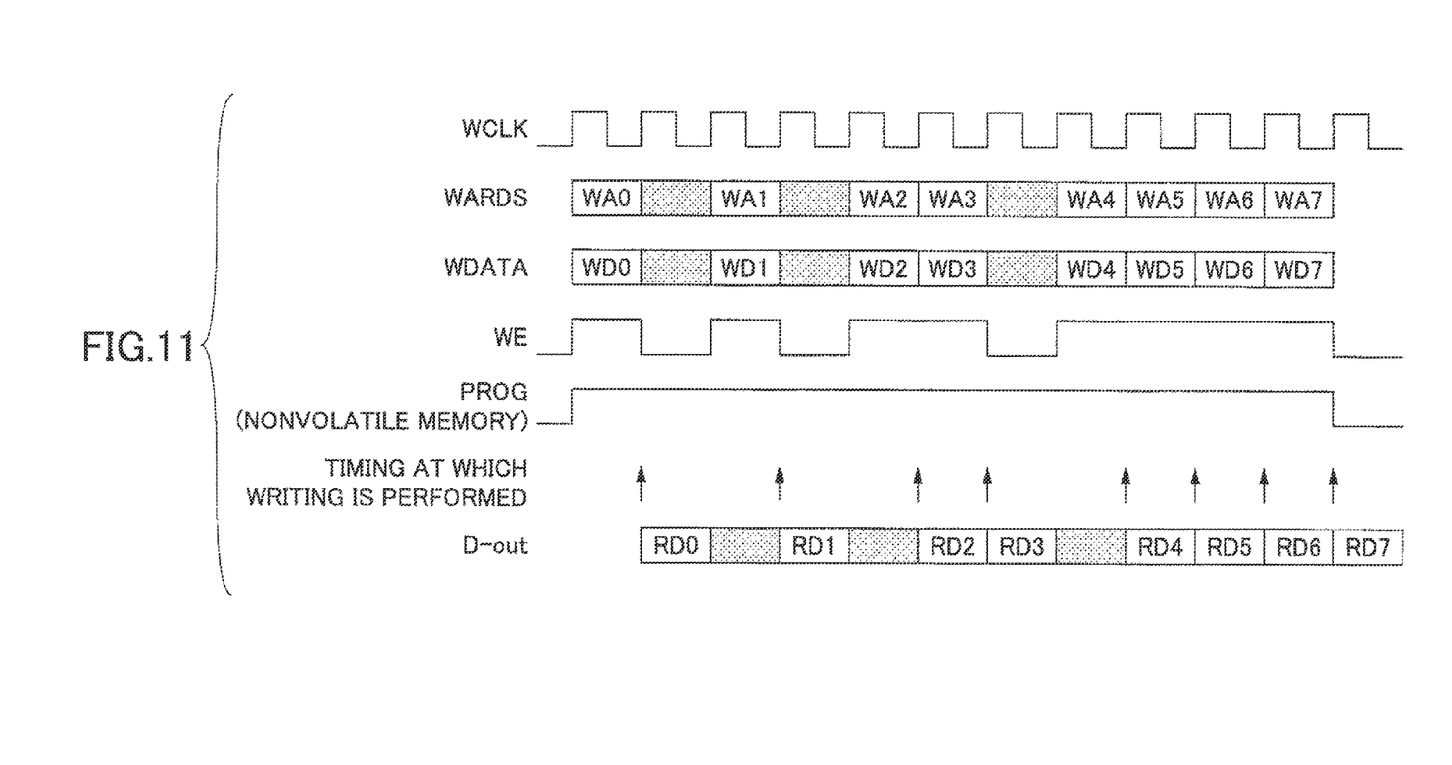
FIG. 11 is a drawing illustrating signals relating to a write operation and a read operation in the semiconductor device illustrated in FIG. 10.

FIG. 11 is a drawing illustrating signals relating to a write operation and a read operation in the semiconductor device illustrated in FIG. 10. As illustrated in FIG. 11, the write control signal generating circuit 20 asserts the write-enable signal WE and supplies the write address WARDS and the write data WDATA in synchronization with the write clock signal WCLK. During the write operation, the enabled-status indicating signal PROG (i.e., program voltage) supplied from the write/read test apparatus 18 is equal to a predetermined write voltage. At the timings indicated by arrows in FIG. 11, data are written to the secure memory 24B. When the write data WDATA is written to the secure memory 24B in a given clock cycle, the written data is output from the data output terminal D-OUT of the secure memory 24B in the next clock cycle. The read data are compared by the data comparison circuit 28 with the write data WDATA as was previously described.

The semiconductor device illustrated in FIG. 10 is configured such that the AND circuit 51 allows the passage of the write data WDATA when the enabled-status indicating signal PRC indicates the enabled state. This is not a limiting example. The AND circuit 51 may be configured such that the write data WDATA is allowed to pass in response to the simultaneous occurrences of two events, i.e., an event in which the enabled-status indicating signal PRC indicates the enabled state and an event in which the write-enable signal WE is in the asserted state.

According to at least one embodiment, the check circuit outputs the result of comparison obtained by comparing the data stored in the nonvolatile memory with the enabled data for comparison only when the write data is enabled as the data for comparison by the enabled-status indicating signal. The semiconductor device has no path to output data retrieved from the nonvolatile memory to an external apparatus, and, further, may output the result of comparison only with respect to the data that is enabled by a write operation for writing data to the nonvolatile memory. Accordingly, it is possible to protect the security of data stored in the nonvolatile memory and also to check from outside whether the data written to the nonvolatile memory is correctly stored.

Further, the present invention is not limited to these embodiments, but various variations and modifications may be made without departing from the scope of the present invention.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A semiconductor device, comprising:
    a nonvolatile memory adapted to store write data in a write-enabled state;
    a check circuit configured to compare first data with second data and to output a result of the comparison, both the first data and the second data being obtained from write data currently supplied to the nonvolatile memory for a current store operation, the first data being the currently supplied write data that is received by the check circuit after undergoing the current store operation and a read operation with respect to the nonvolatile memory, and the second data being the currently supplied write data that is received by the check circuit through a path that does not include nonvolatile memory in response to an enabled-status indicating signal indicative of the write-enabled state; and
    a path configured to output the result of the comparison output from the check circuit to outside the semiconductor device,
    wherein no path to output data read from the nonvolatile memory to outside the semiconductor device is in existence.

2. The semiconductor device as claimed in claim 1, wherein the check circuit includes:
    a volatile memory adapted to store the write data in response to the enabled-status indicating signal,
    wherein data is read from the volatile memory and supplied to the check circuit as the second data.

3. The semiconductor device as claimed in claim 2, wherein a memory volume of the volatile memory is smaller than a memory volume of the nonvolatile memory.

4. The semiconductor device as claimed in claim 3, wherein the result of the comparison is output from the comparison circuit each time data is written to the nonvolatile memory.

5. A semiconductor device, comprising:
a nonvolatile memory adapted to store write data in a write-enabled state;
a check circuit configured to enable the write data as data for comparison in response to an enabled-status indicating signal indicative of the write-enabled state and to output a result of comparison obtained by comparing data read from the nonvolatile memory with the enabled data for comparison; and
a path configured to output the result of comparison output from the check circuit to outside the semiconductor device,
wherein no path to output the data read from the nonvolatile memory to outside the semiconductor device is in existence,
wherein the check circuit includes:
a volatile memory adapted to store the write data as the data for comparison in response to the enabled-status indicating signal; and
a comparison circuit configured to output the result of comparison obtained by comparing the data read from the nonvolatile memory with data read from the volatile memory,
the semiconductor device further comprising:
a nonvolatile redundancy memory;
an address comparison circuit configured to compare a read address with a defective address; and
a selector configured to select one of the data read from the nonvolatile memory and data read from the nonvolatile redundancy memory in response to a result of the comparison performed by the address comparison circuit.

6. A semiconductor device, comprising:
a nonvolatile memory adapted to store write data in a write-enabled state;
a check circuit configured to enable the write data as data for comparison in response to an enabled-status indicating signal indicative of the write-enabled state and to output a result of comparison obtained by comparing data read from the nonvolatile memory with the enabled data for comparison; and
a path configured to output the result of comparison output from the check circuit to outside the semiconductor device,
wherein no path to output the data read from the nonvolatile memory to outside the semiconductor device is in existence,
wherein the check circuit includes:
a volatile memory adapted to store the write data as the data for comparison in response to the enabled-status indicating signal; and
a comparison circuit configured to output the result of comparison obtained by comparing the data read from the nonvolatile memory with data read from the volatile memory,
wherein the volatile memory is provided with a test function to perform a test, and the comparison circuit is configured not to output the result of comparison when the test function of the volatile memory is enabled.

* * * * *